United States Patent [19]

Ishikawa et al.

[11] Patent Number: 5,849,631
[45] Date of Patent: Dec. 15, 1998

[54] METHOD OF MANUFACTURING SEMICONDUCTOR DEVICE

[75] Inventors: Natsuya Ishikawa, Kanagawa; Kiyoshi Hasegawa, Tokyo; Masaki Hatano, Kanagawa, all of Japan

[73] Assignee: Sony Corporation, Tokyo, Japan

[21] Appl. No.: 683,765

[22] Filed: Jul. 17, 1996

[30] Foreign Application Priority Data

Jul. 17, 1995 [JP] Japan .................................... 7-179758

[51] Int. Cl.$^6$ .................................................. H01L 21/321
[52] U.S. Cl. ............................................. 438/615; 438/909
[58] Field of Search ............................. 156/625.1, 643.1; 430/323; 438/613, 615, 909

[56] References Cited

U.S. PATENT DOCUMENTS

| | | | |
|---|---|---|---|
| 4,931,410 | 6/1990 | Tokunaga et al. | 437/189 |
| 5,502,010 | 3/1996 | Nadahara et al. | 438/909 |
| 5,554,559 | 9/1996 | Wolters et al. | 438/909 |
| 5,587,341 | 12/1996 | Masayuki et al. | 437/206 |

*Primary Examiner*—John Goodrow
*Attorney, Agent, or Firm*—Hill & Simpson

[57] ABSTRACT

A method of manufacturing a semiconductor device includes the steps of: patterning a first passivation film on a semiconductor substrate; patterning a ball limiting metal film; patterning a second passivation film; performing a heat-treatment for hardening the second passivation film and annealing the ball limiting metal film; patterning a bump forming metal film; and wet-back processing the bump forming metal film. In this method, the heat-treatment may be performed in an atmosphere having an oxygen concentration of 50 ppm or less at a temperature of from 300° to 400° C. for 10 to 30 minutes. Additionally, at least one of the first and second passivation films may be a polyimide film, and the ball limiting metal film may has a three layer structure of a Ti layer, a Cu layer and an Au layer laminated from the bottom in this order.

22 Claims, 3 Drawing Sheets

METHOD OF MANUFACTURING SEMICONDUCTOR DEVICE

BACKGROUND OF THE INVENTION

The present invention relates to a method of manufacturing a semiconductor device, and particularly to a method of forming solder bumps on a semiconductor chip.

The formation of solder bumps on a semiconductor chip is generally performed as follows: A first passivation film made of polyimide is formed in a specified pattern on a semiconductor chip which has been already processed up to a step of forming an opening portion for an aluminum made pad electrode, and a ball limiting metal (BLM) film functioning as both a barrier metal layer and a bonding layer is formed thereon in a specified pattern. A second passivation film 6 made of polyimide is then patterned to form an electrode region of the BLM film. The semiconductor chip in this state is put in a heating furnace in atmospheric air and is heated at a temperature of about 350° C. for about 30 minutes for hardening (curing) the second passivation film.

Next, solder is deposited on the semiconductor chip thus processed to form a bump forming metal film (solder).

The semiconductor chip formed with the bump forming metal film is then subjected to a specified heat-treatment (wet-back processing), to form ball-like solder bumps.

The above steps are shown by a flow chart in FIG. 2, which include a first passivation film patterning step P1; a BLM film patterning step P2; a second passivation film patterning step P3; a second passivation film hardening (curing) step P4; a bump forming metal film patterning step P5; and a wet-back processing step P6.

The above-described BLM film generally has a three layer structure of a Cr or Ti layer, a Cu layer, and an Au layer. Of these layers, the Cr or Ti lower layer functions as a bonding layer for the electrode pad; the Cu intermediate layer functions as a layer for preventing diffusion of solder; and the Au upper layer functions as a layer for preventing oxidation of Cu.

The above-described method of manufacturing a semiconductor device, however, has a disadvantage that the Cu layer, in the BLM film, functioning as the layer for preventing diffusion of solder and Pb in a solder film used as a bump forming metal layer react with each other by diffusion during wet-back processing after formation of the solder film as the bump forming metal film and the Au layer is substantially lost by diffusion into solder during such a heat-treatment, resulting in the reduced strength of the BLM film.

SUMMARY OF THE INVENTION

An object of the present invention is to provide a method of manufacturing a semiconductor device which is capable of forming a stable BLM film which suppresses generation of a diffusion reaction by heat-treatment applied after formation of the BLM film.

According to a first aspect of the present invention, there is provided a method of manufacturing a semiconductor device, including the steps of: patterning a first passivation film on a semiconductor substrate; patterning a ball limiting metal film; patterning a second passivation film; performing a heat-treatment for hardening the second passivation film and simultaneously annealing the ball limiting metal film; patterning a bump forming metal film; and wet-back processing the bump forming metal film.

According to a second aspect of the present invention, there is provided a method of manufacturing a semiconductor device, including the steps of: patterning a first polyimide film on a semiconductor substrate; patterning a ball limiting metal film; patterning a second polyimide film; performing a heat-treatment for hardening the second polyimide film and simultaneously annealing the ball limiting metal film; patterning a bump forming metal film; and wet-back processing the bump forming metal film.

According to a third aspect of the present invention, there is provided a method of manufacturing a semiconductor device, including the steps of: patterning a first passivation film on a semiconductor substrate; patterning a ball limiting metal film; patterning a second passivation film; performing a heat-treatment for hardening the second passivation film and simultaneously annealing the ball limiting metal film, the heat-treatment being performed in an atmosphere having an oxygen concentration of 50 ppm or less at a temperature of from 300° to 400° C. for 10 to 30 minutes; patterning a bump forming metal film; and wet-back processing the bump forming metal film.

In the manufacturing method having the above configurations, the BLM film is made more dense in the step of performing a heat-treatment for hardening the second passivation film and simultaneously annealing the ball limiting metal film, and thereby thermal diffusion between Cu in the BLM film and Pb in the bump metal can be suppressed, which has been generated during wet-back processing (heat-treatment) in the related art method, thus making it possible to form bumps which are prevented from being broken due to reduction in the strength of the BLM film.

BRIEF DESCRIPTION OF THE DRAWINGS

FIGS. 3A to 3E are sectional side views showing states of respective steps for manufacturing a semiconductor chip: wherein FIG. 3A shows a state after patterning of a first passivation film; FIG. 3B shows a state after patterning of a BLM film; FIG. 3C shows a state after patterning of a second passivation film; FIG. 3D shows a state after patterning of a bump forming metal film; and FIG. 3E shows a state after wet-back processing.

DETAILED DESCRIPTION OF THE PREFERRED EMBODIMENT

Figure 1:
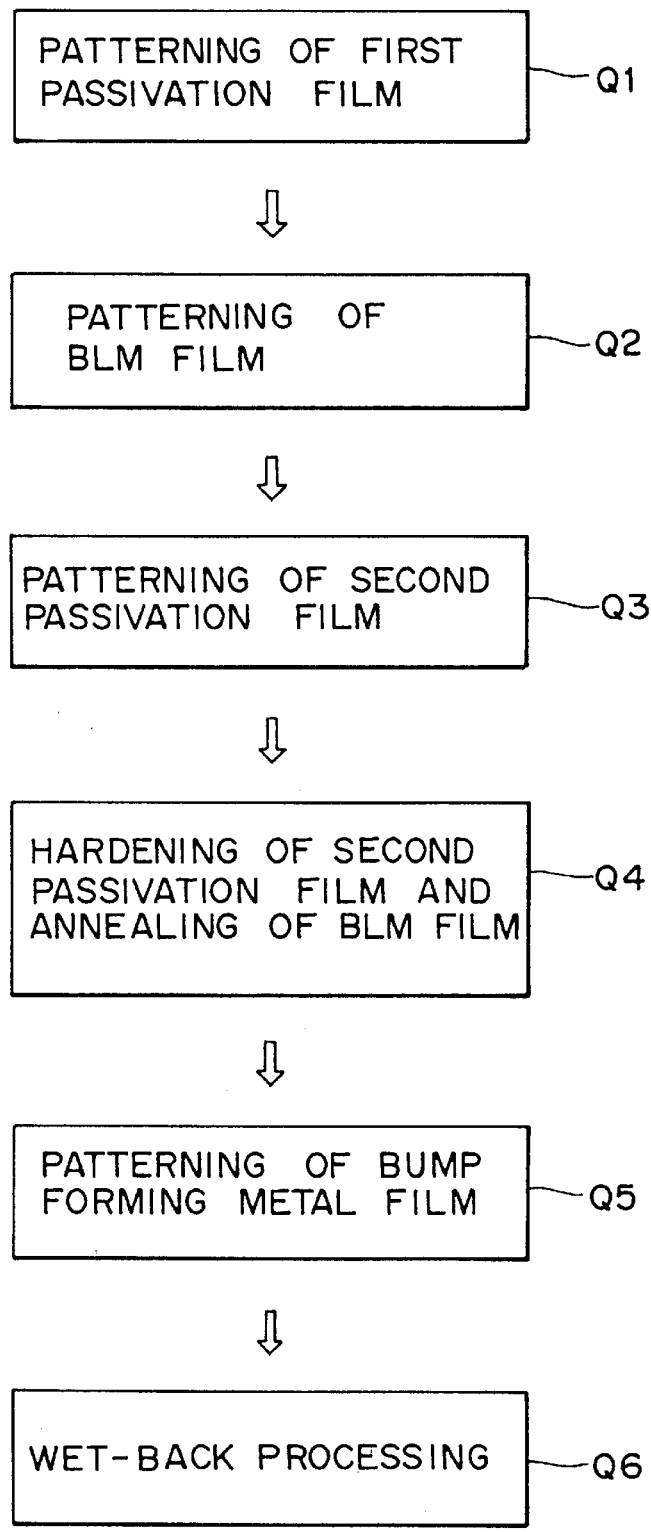
FIG. 1 is a flow chart showing steps of manufacturing a semiconductor device of the present invention.
Figure 2:
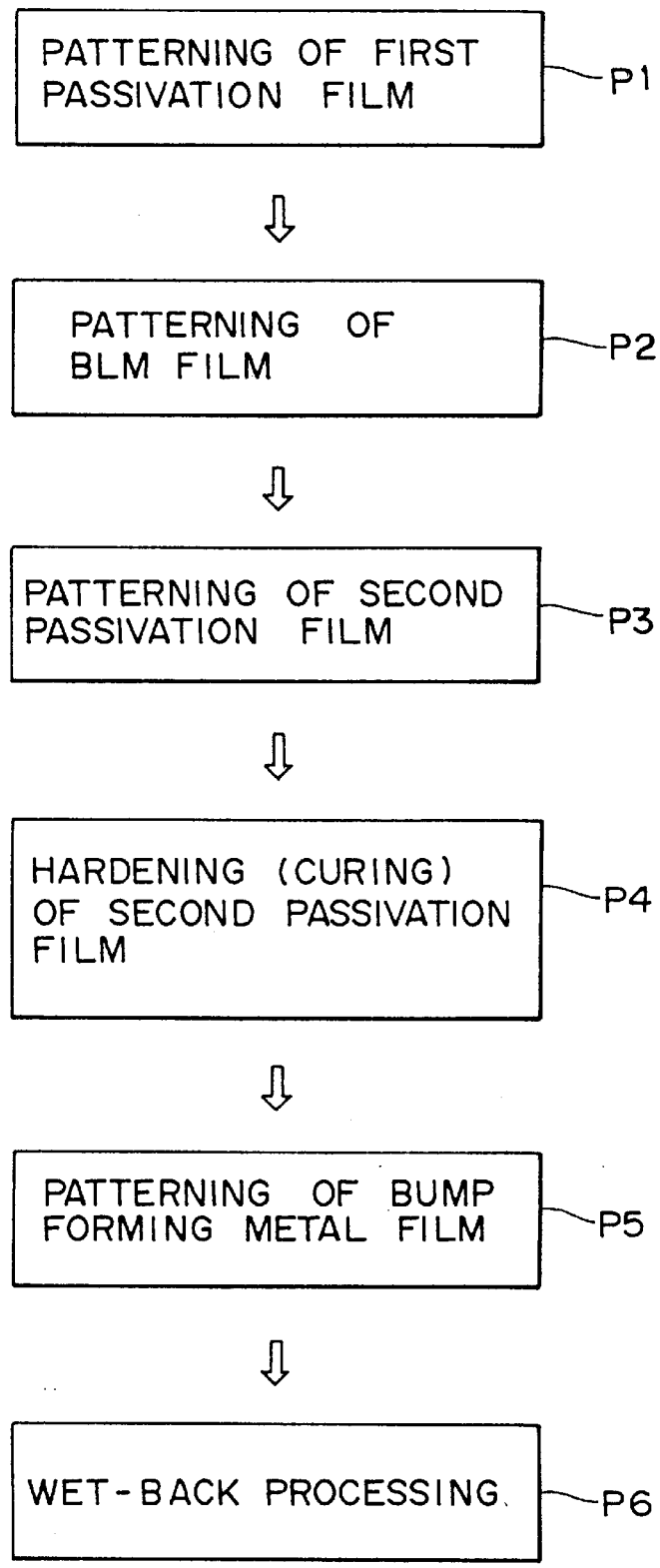
FIG. 2 is a flow chart showing steps of manufacturing a related art semiconductor device.

A method of manufacturing a semiconductor device of the present invention will be described with reference to FIG. 1 and FIGS. 3A to 3E.

A polyimide film as a first passivation film 3 is formed in a specified pattern on a semiconductor chip 2 which has been already processed up to a step in which an opening portion for an aluminum made pad electrode 1 is formed in a SiN film 5 on a semiconductor substrate. A BLM film 6 functioning as both a barrier metal film and a bonding film is then formed thereon in a specified pattern by sputtering or the like. It is to be noted that the SiN 5 may serves as the first passivation film.

Figure 3A:
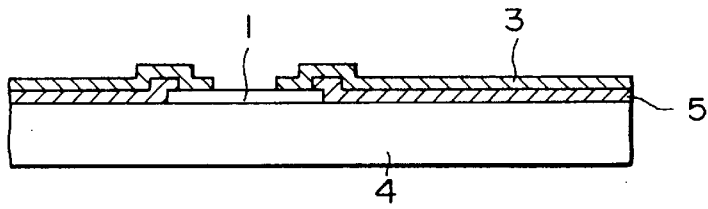
Figure 3B:
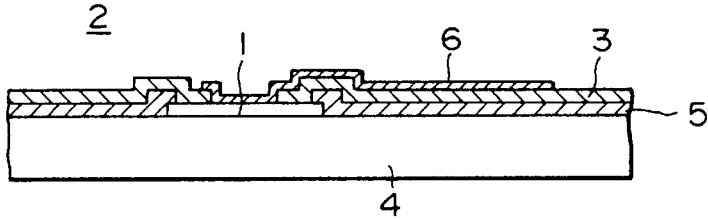
Figure 3C:
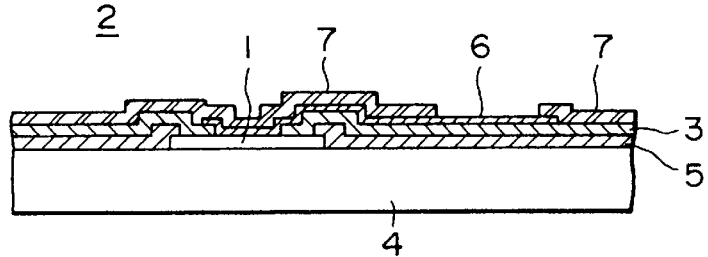
Figure 3D:
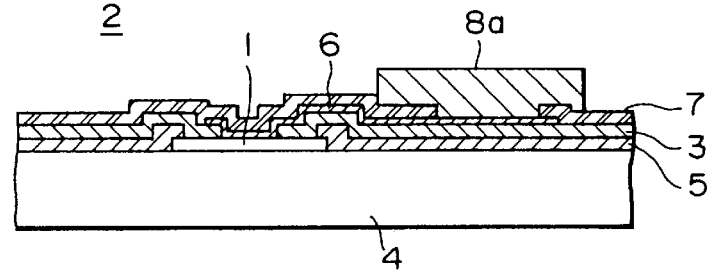

According to the present invention, the semiconductor chip 2 in a state shown in FIG. 3C is subjected to the following processing.

The semiconductor chip 2 is heat-treated (annealed) in a low oxygen concentration atmosphere having a concentration of oxygen contained in nitrogen being 50 ppm or less at a temperature of from 300° to 400° C. for 10 to 40 minutes while simultaneously performing both reforming of the BLM film 6 and hardening (curing) of the second passivation film 7 made of polyimide or the like. Here, the oxygen concentration in annealing may be set at a value not allowing oxidation of the BLM film.

Figure 3E:
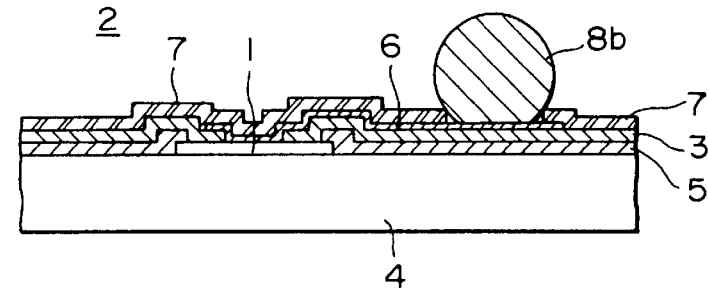

After that, a bump forming metal film 8a is formed in a specified pattern by vapor-deposition or the like, followed by wet-back processing in accordance with a specified thermal profile, to form ball-like bumps 8b on the BLM film as shown in FIG. 3E.

In the above steps, the BLM film that is heat-treated (annealed) in a low oxygen concentration atmosphere as described above is made more dense, and thereby the thermal diffusion between Cu in the BLM film and Pb in the bump metal is suppressed, which has been generated during wet-back processing (heat-treatment) in the related art method, thus making it possible to form bumps prevented from being broken due to reduction in strength of the BLM film.

The hardening of the second passivation film performed simultaneously with the annealing of the BLM film also reduces the number of steps.

The steps of manufacturing a semiconductor device of the present invention is shown in FIG. 1, which include a first passivation film patterning step Q1; a BLM film patterning step Q2; a second passivation film patterning step Q3; a second passivation film hardening and BLM film annealing step Q4; a bump forming metal film patterning step Q5; and a wet-back processing step Q6.

While the preferred embodiment of the present invention has been described, such description is for illustrative purposes only, and it is to be understood that changes and variations may be made without departing from the spirit or scope of the following claims.

What is claimed is:

1. A method of manufacturing a semiconductor device, comprising the steps of:
    patterning a first passivation film on a semiconductor substrate;
    patterning a ball limiting metal film;
    patterning a second passivation film;
    performing a heat-treatment for hardening said second passivation film and simultaneously annealing said ball limiting metal film in a an atmosphere having an oxide concentration being a value not allowing oxidation of said ball limiting metal film or less, said performing said heat-treatment step being performed before application of a bump forming metal to prevent diffusion of said ball limiting metal film and said second passivation film with a bump forming metal;
    patterning a bump forming metal film; and
    wet-back processing said bump forming metal film.

2. A method of manufacturing a semiconductor device according to claim 1, wherein said step of performing a heat-treatment for hardening said second passivation film and simultaneously annealing said ball limiting metal film is performed in an atmosphere having an oxide concentration in a range of 50 ppm or less.

3. A method of manufacturing a semiconductor device according to claim 1, wherein said step of performing a heat-treatment for hardening said second passivation film and simultaneously annealing said ball limiting metal film is performed in an atmosphere having a concentration of oxygen contained in nitrogen in a range of 50 ppm or less.

4. A method of manufacturing a semiconductor device according to claim 2, wherein said step of performing a heat-treatment for hardening said second passivation film and simultaneously annealing said ball limiting metal film is performed at a temperature of from 300° to 400° C.

5. A method of manufacturing a semiconductor device according to claim 3, wherein said step of performing a heat-treatment for hardening said second passivation film and simultaneously annealing said ball limiting metal film is performed at a temperature of from 300° to 400° C.

6. A method of manufacturing a semiconductor device according to claim 2, wherein said step of performing a heat-treatment for hardening said second passivation film and simultaneously annealing said ball limiting metal film is performed at a temperature of from 300° to 400° C. for 10 to 30 minutes.

7. A method of manufacturing a semiconductor device according to claim 3, wherein said step of performing a heat-treatment for hardening said second passivation film and simultaneously annealing said ball limiting metal film is performed at a temperature of from 300° to 400° C. for 10 to 30 minutes.

8. A method of manufacturing a semiconductor device according to claim 1, wherein one of said first and second passivation films is a polyimide film.

9. A method of manufacturing a semiconductor device according to claim 1, wherein each of said first and second passivation films is a polyimide film.

10. A method of manufacturing a semiconductor device according to claim 1, wherein said ball limiting metal film has a three layer structure of a Ti layer, a Cu layer and an Au layer laminated from the bottom in this order.

11. A method of manufacturing a semiconductor device, comprising the steps of:
    patterning a first polyimide film on a semiconductor substrate;
    patterning a ball limiting metal film;
    patterning a second polyimide film;
    performing a heat-treatment for hardening said second polyimide film and simultaneously annealing said ball limiting metal film in an atmosphere having an oxide concentration being a value not allowing oxidation of said ball limiting metal film or less, said performing said heat-treatment step prior to application of a bump forming metal film;
    patterning a bump forming metal film; and
    wet-back processing said bump forming metal film.

12. A method of manufacturing a semiconductor device according to claim 11, wherein said step of performing a heat-treatment for hardening said second polyimide film and simultaneously annealing said ball limiting metal film is performed in an atmosphere having an oxide concentration in a range of 50 ppm or less.

13. A method of manufacturing a semiconductor device according to claim 11, wherein said step of performing a heat-treatment for hardening said second polyimide film and simultaneously annealing said ball limiting metal film is performed in an atmosphere having a concentration of oxygen contained in nitrogen in a range of 50 ppm or less.

14. A method of manufacturing a semiconductor device according to claim 12, wherein said step of performing a heat-treatment for hardening said second polyimide film and simultaneously annealing said ball limiting metal film is performed at a temperature of from 300° to 400° C.

15. A method of manufacturing a semiconductor device according to claim 13, wherein said step of performing a heat-treatment for hardening said second polyimide film and simultaneously annealing said ball limiting metal film is performed at a temperature of from 300° to 400° C.

16. A method of manufacturing a semiconductor device according to claim 12, wherein said step of performing a heat-treatment for hardening said second polyimide film and simultaneously annealing said ball limiting metal film is performed at a temperature of from 300° to 400° C. for 10 to 30 minutes.

17. A method of manufacturing a semiconductor device according to claim 13, wherein said step of performing a heat-treatment for hardening said second polyimide film and simultaneously annealing said ball limiting metal film is performed at a temperature of from 300° to 400° C. for 10 to 30 minutes.

18. A method of manufacturing a semiconductor device according to claim 11, wherein said ball limiting metal film has a three layer structure of a Ti layer, a Cu layer and an Au layer laminated from the bottom in this order.

19. A method of manufacturing a semiconductor device, comprising the steps of:

patterning a first passivation film on a semiconductor substrate;

patterning a ball limiting metal film;

patterning a second passivation film;

performing a heat-treatment for hardening said second passivation film and simultaneously annealing said ball limiting metal film, said heat treatment being performed in an atmosphere having an oxygen concentration of 50 ppm or less at a temperature of from 300° to 400° C. for 10 to 30 minutes before application of a bump forming metal film;

patterning a bump forming metal film; and wet-back processing said bump forming metal film.

20. A method of manufacturing a semiconductor device according to claim 19, wherein one of said first and second passivation films is a polyimide film.

21. A method of manufacturing a semiconductor device according to claim 19, wherein each of said first and second passivation films is a polyimide film.

22. A method of manufacturing a semiconductor device according to claim 19, wherein said ball limiting metal film has a three layer structure of a Ti layer, a Cu layer and an Au layer laminated from the bottom in this order.

* * * * *